(12) United States Patent
Hu et al.

(10) Patent No.: US 11,696,464 B2
(45) Date of Patent: Jul. 4, 2023

(54) DISPLAY PANEL, MANUFACTURING METHOD THEREOF AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xuwu Hu, Beijing (CN); Yangsheng Liu, Beijing (CN); Mengxia Kong, Beijing (CN); Yuheng Qiu, Beijing (CN); Wei Lin, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 286 days.

(21) Appl. No.: 16/926,486

(22) Filed: Jul. 10, 2020

(65) Prior Publication Data

US 2021/0193961 A1   Jun. 24, 2021

(30) Foreign Application Priority Data

Dec. 20, 2019  (CN) .......................... 201911326560.5

(51) Int. Cl.
*H01L 51/56* (2006.01)
*H10K 50/844* (2023.01)
*H10K 59/40* (2023.01)
*H10K 59/122* (2023.01)
*H10K 71/00* (2023.01)
*H10K 59/12* (2023.01)

(52) U.S. Cl.
CPC ........ *H10K 50/844* (2023.02); *H10K 59/122* (2023.02); *H10K 59/40* (2023.02); *H10K 71/00* (2023.02); *H10K 59/1201* (2023.02)

(58) Field of Classification Search
CPC ........................... H01L 51/5253; H01L 51/56
See application file for complete search history.

(56) References Cited

U.S. PATENT DOCUMENTS

2020/0258952 A1* 8/2020 Bok .................... H01L 27/3272
2020/0312933 A1* 10/2020 Lee .................... H01L 27/3258
2020/0321561 A1* 10/2020 Park .................... H01L 27/3272

* cited by examiner

*Primary Examiner* — Fernando L Toledo
*Assistant Examiner* — Valerie N Newton
(74) *Attorney, Agent, or Firm* — McCoy Russell LLP

(57) ABSTRACT

A display panel, a manufacturing method thereof and a display device are provided. The display panel includes a display area and a hole forming area, where the display area surrounds the hole forming area, and an organic material layer is provided in the hole forming area so that a height difference between the hole forming area and the display area is less than a threshold value of 4 um.

4 Claims, 2 Drawing Sheets

DISPLAY PANEL, MANUFACTURING METHOD THEREOF AND DISPLAY DEVICE

CROSS-REFERENCE TO RELATED APPLICATION

The present application claims priority to Chinese Patent Application No. 201911326560.5, filed on Dec. 20, 2019. The entire contents of the above-listed application is hereby incorporated by reference for all purposes.

TECHNICAL FIELD

The present disclosure relates to the field of display technology, and in particular to a display panel, a manufacturing method thereof and a display device.

BACKGROUND

In full-screen display products, holes are opened on the display screen, and devices such as cameras and sensors are installed in the hole areas. This can reduce the space occupied by cameras, sensors and the like, and increase the screen-to-body ratio.

In the related art, in order to facilitate subsequent cutting in the hole forming area, the display film layer of the hole forming area is removed during the manufacture of an organic light-emitting diode (OLED) display panel. As a result, a height difference between a surface of the OLED display panel in the hole forming area and a surface of the OLED display panel in a display area is relatively large, ranging from 8 um to 10 um. When a touch function layer is subsequently formed on the OLED display panel, due to process requirements, the OLED display panel needs to be planarized first. The planarization material can be applied on the OLED display panel by coating, but the maximum coating thickness that can be achieved in a single coating process is 4 um. Therefore, at least two coating processes have to be performed, which results in more manufacturing processes of the OLED display panel, increases the production time of the OLED display panel, and makes the production cost of the OLED display panel higher.

SUMMARY

To solve the above technical problems, the embodiments of the present disclosure provide technical solutions as follows.

In an aspect of the present disclosure, a display panel is provided. The display panel includes a display area and a hole forming area, where the display area surrounds the hole forming area, an organic material layer is provided in the hole forming area so that a height difference between the hole forming area and the display area is less than a threshold value of 4 um.

Optionally, the display area includes: a thin film transistor array layer on a base substrate, a planarization layer covering the thin film transistor array layer, and a pixel definition layer on the planarization layer.

Optionally, the organic material layer includes a first organic material sub-layer and a second organic material sub-layer that are stacked, the first organic material sub-layer is made of a same material as the pixel defining layer of the display area, the second organic material sub-layer is made of a same material as the planarization layer of the display area.

Optionally, a thickness of the first organic material sub-layer is greater than a thickness of the pixel defining layer of the display area; a thickness of the second organic material sub-layer is greater than a thickness of the planarization layer of the display area.

Optionally, the display panel further includes: a thin film encapsulation layer covering the hole forming area and the display area.

Optionally, the display panel further includes a separation wall, where the separation wall is located between the display area and the hole forming area, and is configured to prevent liquid crystals from flowing out of the display area.

Optionally, the separation wall includes a first separation sub-wall and a second separation sub-wall; the first separation sub-wall is made of a same material as the first organic material sub-layer, and the second separation sub-wall is made of a same material as the second organic material sub-layer.

The present disclosure further provides, in an embodiment, a method of manufacturing a display panel, where the display panel includes a display area and a hole forming area, the display area surrounds the hole forming area; the display area includes: a thin film transistor array layer on a base substrate, a planarization layer covering the thin film transistor array layer, and a pixel defining layer on the planarization layer;

the method includes:

forming a second organic material sub-layer in the hole forming area and the planarization layer in the display area through a single patterning process;

forming a first organic material sub-layer in the hole forming area and the pixel defining layer in the display area through a single patterning process, where the first organic material sub-layer and the second organic material sub-layer form the organic material layer.

Optionally, a height difference between the hole forming area and the display area is less than a threshold value of 4 um.

Optionally, the forming the second organic material sub-layer in the hole forming area and the planarization layer in the display area through the single patterning process includes:

forming a photosensitive organic material layer;

exposing the photosensitive organic material layer by using a gray-tone mask, where the gray-tone mask includes a partially light-transmitting pattern corresponding to the display area and an opaque pattern corresponding to the hole forming area;

performing a development process to form the second organic material sublayer in the hole forming area and the planarization layer in the display area, where a thickness of the second organic material sub-layer is greater than a thickness of the planarization layer in the display area.

Optionally, the forming the first organic material sub-layer in the hole forming area and the pixel defining layer in the display area through the single patterning process includes:

forming a photosensitive organic material layer;

exposing the photosensitive organic material layer by using a gray-tone mask, where the gray-tone mask includes a partially light-transmitting pattern corresponding to the display area and an opaque pattern corresponding to the hole forming area;

performing a development process to form the first organic material sublayer in the hole forming area and the pixel defining layer in the display area, where a thickness of the first organic material sub-layer is greater than a thickness of the pixel defining layer in the display area.

Optionally, the method further includes: forming a thin film encapsulation layer covering the hole forming area and the display area.

The present disclosure further provides, in an embodiment, a display device including the display panel described above, where the display device further includes: a planarization layer on a thin film encapsulation layer of the display panel; and a touch function layer on the planarization layer.

Figure 1:
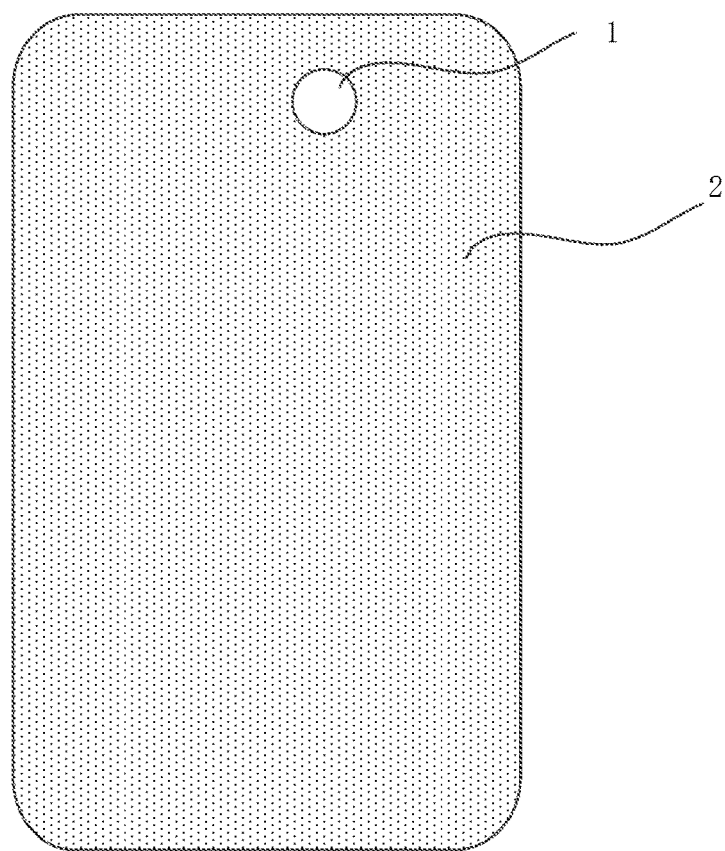
FIG. 1 is a schematic diagram of a display product.

REFERENCE NUMERALS 1, 14 hole forming area
2 display area
3 base substrate
4 planarization layer
5 anode
6 pixel defining layer
7 cathode
8 first inorganic thin film
9 organic film
10 second inorganic thin film
11 light-emitting layer
12 second separation sub-wall
13 first separation sub-wall
15 second organic material sub-layer
16 first organic material sub-layer
17 area between the hole forming area and the display area

DETAILED DESCRIPTION

To describe the objective, the technical solutions and the advantages of embodiments of the present disclosure more clearly, a detailed description in conjunction with drawings and the embodiments of the present disclosure is given below.

As shown in FIG. 1, a display product is provided with a hole forming area 1, and the display area 2 surrounds the hole forming area 1. The hole forming area is used to accommodate a device such as a camera or a sensor. The hole forming area 1 may be circular, rectangular, or special-shaped. When the hole forming area 1 is circular, the diameter of the hole forming area 1 may range from 4 mm to 10 mm.

Figure 2:
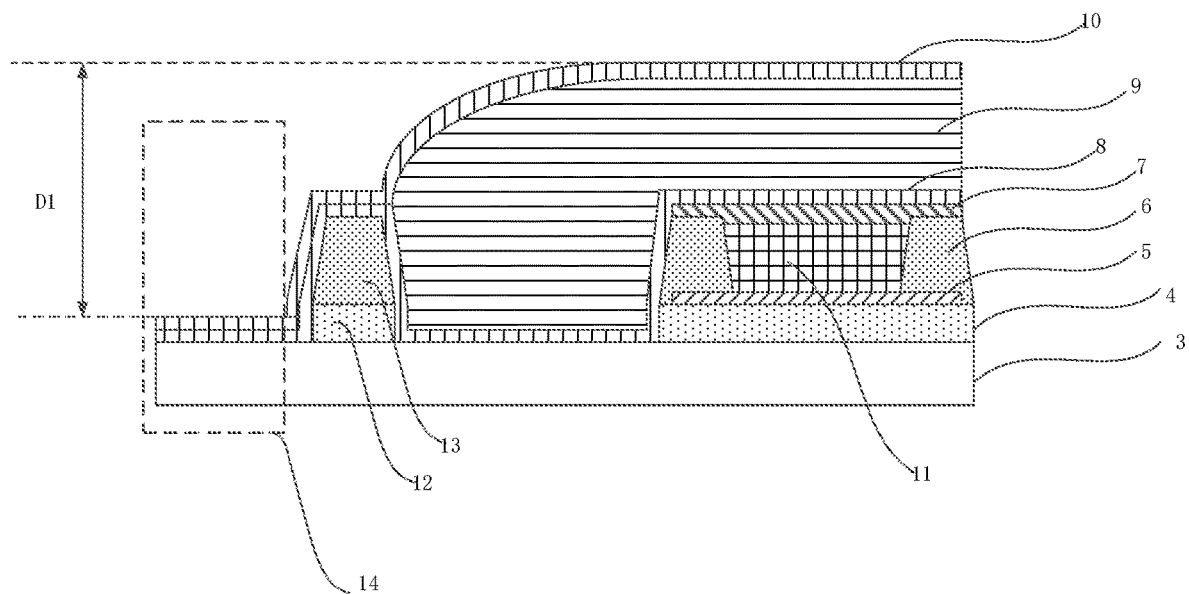
FIG. 2 is a schematic cross-sectional view of a display panel in the related art.

In the related art, in order to facilitate subsequent cutting of the hole forming area 2, the display film layer of the hole forming area 2 is removed during the manufacture of the OLED display panel. As shown in FIG. 2, in the display area, a base substrate 3 is provided with a planarization layer 4, an anode 5 on the planarization layer 4, a pixel defining layer 6, a light-emitting layer 11 located in an area defined by the pixel defining layer 6, a cathode 7, a first inorganic thin film 8, an organic thin film 9 and a second inorganic thin film 10, where the first inorganic thin film 8, the organic thin film 9, and the second inorganic thin film 10 form an thin film encapsulation layer; in the hole forming area 14, the base substrate 3 is only provided with the first inorganic thin film 8 and the second inorganic thin film 10 of the thin film encapsulation layer. It can be seen from FIG. 2 that a height difference between the surface of the display panel in the hole forming area 14 and the surface of the display panel in the display area is D1, and the value of D1 is usually relatively large and ranges from 8 um to 10 um. When the touch function layer is subsequently formed on the display panel, due to process requirements, the display panel needs to be planarized. Conventionally, a planarization material can be applied on the display panel by coating, but the maximum coating thickness that can be achieved in a single coating process is 4 um. Due to the large value of D1, at least two coating processes have to be performed, which results in more manufacturing processes of the display panel, increases the production time of the display panel, and makes the production cost of the display panel higher. In order to solve the above problems, embodiments of the present disclosure provide a display panel, a manufacturing method thereof, and a display device, which can reduce the manufacturing processes of the display device, speed up the production pace of the display device, and reduce the production cost of the display device.

The present disclosure provides, in an embodiment, a display panel, including a display area and a hole forming area, where the display area surrounds the hole forming area, an organic material layer is provided in the hole forming area so that a height difference between the hole forming area and the display area is less than a threshold value of 4 um.

In this embodiment, the height difference between the hole forming area and the display area is less than the threshold value, so that the height difference between the hole forming area and the display area is relatively small, and may not be greater than the thickness of the planarization material formed by one coating process. In this way, in the subsequent planarization process, a planar surface can be obtained by performing a single coating process on the display panel, which can reduce the manufacturing processes of the display device, speed up the production pace of the display device, and reduce the production cost of the display device.

Since the thickness of formed organic material is generally relatively large, and is on the order of microns, which is greater than the thickness of formed inorganic material (on the order of nanometers), an organic material layer can be formed in the hole forming area and is used to reduce the height difference between the hole forming area and the display area.

Since the thickness of the planarization material formed by one coating is about 4 um, the threshold value may be 4 um, that is, the height difference between the hole forming area and the display area is not more than 4 um. Thus, when the planarization process is performed subsequently, a planar surface can be obtained by performing a single coating process on the display panel.

Specifically, the height difference between the hole forming area and the display area may be 2 um to 4 um.

In order not to add an additional patterning process, while some of the functional film layers in the display area are being formed, the functional film layers can also be formed in the hole forming area, which can increase the thickness of the display panel in the hole forming area and reduce the height difference between the hole forming area and the display area. That is, the organic material layer is made of the same materials as some functional film layers of the display area.

In a specific example, the display area includes: a thin film transistor array layer on a base substrate; a planarization layer covering the thin film transistor array layer; a pixel definition layer on the planarization layer.

The pixel defining layer and the planarization layer of the display area are made of organic materials. Therefore, the organic material layer of the same materials as the pixel defining layer and the planarization layer can be formed in the hole forming area while the pixel defining layer and the planarization layer of the display area are being formed.

Optionally, the organic material layer includes a first organic material sub-layer and a second organic material sub-layer that are stacked, the first organic material sub-layer is made of a same material as the pixel defining layer of the display area, the second organic material sub-layer is made of a same material as the planarization layer of the display area. In this way, the first organic material layer can be formed in the hole forming area while the pixel defining layer of the display area is being formed; and the second organic material layer can be formed in the hole forming area while the planarization layer of the display area is being formed.

As shown in FIG. 2, in the related art, the pixel defining layer 6 and the planarization layer 4 are provided in the display area, and the pixel defining layer 6 and the planarization layer 4 are not kept in the hole forming area 14, resulting in a height difference D1 of about 8 um to 10 um between the hole forming area 14 and the display area.

Figure 3:
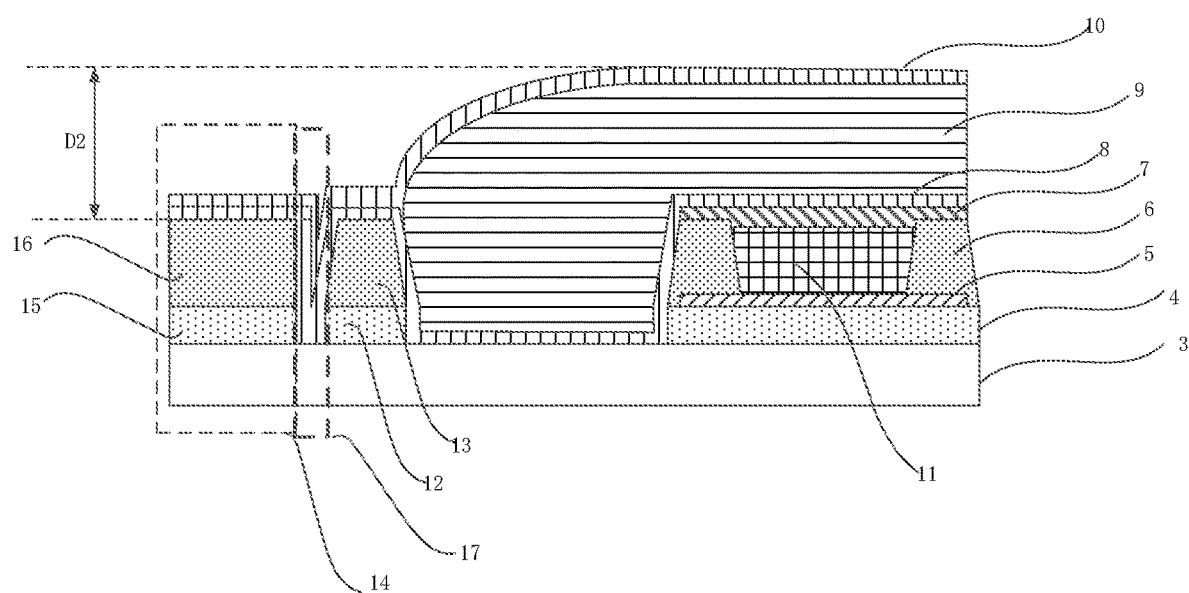
FIG. 3 is a schematic cross-sectional view of a display panel according to an embodiment of the present disclosure.

As shown in FIG. 3, in this embodiment, a second organic material sub-layer 15 and a first organic material sub-layer 16 are provided in the hole forming area 14, and the second organic material sub-layer 15 is made of the same material as the planarization layer 4, the first organic material sub-layer 16 is made of the same material as the pixel defining layer 6. By forming the organic material layer with the second organic material sub-layer 15 and the first organic material sub-layer 16, the thickness of the display panel in the hole forming area is increased, such that the height difference between the surface of the display panel in the hole forming area 14 and the surface of the display panel in the display area is reduced to D2, which ranges from 2 um to 4 um.

As long as it is ensured that the height difference between the surface of the display panel in the hole forming area 14 and the surface of the display panel in the display area is not more than 4 um, the thickness of the second organic material sub-layer 15 may be the same as the thickness of the planarization layer 4 of the display area, or may be less than the thickness of the planarization layer 4 of the display area, or may be greater than the thickness of the planarization layer 4 of the display area; the thickness of the first organic material sub-layer 16 may be the same as the thickness of the pixel defining layer 6 in the display area, or may be less than the thickness of the pixel defining layer 6 in the display area, or may be greater than the thickness of the pixel defining layer 6 in the display area.

When the thickness of the second organic material sub-layer 15 is different from the thickness of the planarization layer 4 of the display area, the second organic material sub-layer 15 and the planarization layer 4 can be fabricated by using a halftone mask or a gray-tone mask; when the thickness of the first organic material sub-layer 16 is different from the thickness of the pixel defining layer 6 in the display area, the first organic material sub-layer 16 and the pixel defining layer 6 can be fabricated by using a halftone mask or a gray-tone mask.

In a specific example, the thickness of the first organic material sub-layer may be greater than the thickness of the pixel defining layer of the display area; the thickness of the second organic material sublayer may be greater than the thickness of the planarization layer of the display area.

Specifically, as shown in FIG. 3, a separation wall is provided on an edge of the display area that is near the hole forming area. The separation wall defines the hole forming area. The separation wall includes a second separation sub-wall 12 and a first separation sub-wall 13, the second separation sub-wall 12 is made of the same material as the planarization layer 4, and the first separation sub-wall 13 is made of the same material as the pixel defining layer 6. In the related art, the thickness of the second separation sub-wall 12 is the same as the thickness of the planarization layer 4 of the display area, which can be about 2 um, and the thickness of the first separation sub-wall 13 can be larger than the thickness of the pixel defining layer 6 of the display area by about 2 um. In this embodiment, the thickness of the planarization layer 4 of the display area may still be about 2 um, the thickness of the second organic material sub-layer 15 may be about 4 um, the thickness of the pixel defining layer 6 of the display area may be about 2 um, the thickness of the first organic material sub-layer 16 may be about 4 um, and the thickness of the first organic material sub-layer 16 may be the same as the thickness of the first separation sub-wall 13, so that the height difference between the surface of the display panel in the hole forming area 14 and the surface of the display panel in the display area ranges from 2 um to 4 um.

Further, the display panel includes a thin film encapsulation layer covering the hole forming area and the display area. As shown in FIG. 3, the thin film encapsulation layer is composed of a first inorganic thin film 8, an organic thin film 9 and a second inorganic thin film 10, where the organic thin film 9 is only provided in the display area, and the separation wall and the hole forming area are only provided with the first inorganic thin film 8 and the second inorganic thin film 10. The surface of the display panel is the surface of the thin film encapsulation layer that is away from the base substrate 3.

When the display panel is used to manufacture a display device, the hole forming area needs to be formed to accommodate devices such as cameras, sensors, and the like in the hole forming area. In order to facilitate the formation of the hole forming area, the organic material layer of the hole forming area and the film layer of the display area may be independent of each other. As shown in FIG. 3, the area 17 between the hole forming area and the display area is only provided with the first inorganic thin film 8 and the second inorganic thin film 10, the second organic material sub-layer 15 of the hole forming area and the second separation sub-wall 12 are independent of each other, and the first organic material sub-layer 16 and the first separation sub-wall 13 are independent of each other.

The present disclosure further provides, in an embodiment, a method of manufacturing a display panel, where the display panel includes a display area and a hole forming area, the display area surrounds the hole forming area; the display area includes: a thin film transistor array layer on a base substrate, a planarization layer covering the thin film transistor array layer, a pixel defining layer on the planarization layer; the method includes: forming a second organic material sub-layer in the hole forming area and the planarization layer in the display area through a single patterning process; and forming a first organic material sub-layer in the hole forming area and the pixel defining layer in the display area through a single patterning process, where the first organic material sub-layer and the second organic material sub-layer form the organic material layer.

In this embodiment, an organic material layer is provided in the hole forming area, so that the height difference between the hole forming area and the display area is relatively small, and may be not greater than the thickness of the planarization material formed by one coating process. In this way, in the subsequent planarization process, a planar surface can be obtained by performing a single coating process on the display panel, which can reduce the manufacturing process of the display device, speed up the production pace of the display device, and reduce the production cost of the display device.

Since the thickness of formed organic material is generally relatively large, and is on the order of microns, which is greater than the thickness of formed inorganic material (on the order of nanometers), an organic material layer can be formed in the hole forming area and is used to reduce the height difference between the hole forming area and the display area.

After the organic material layer is formed, the height difference between the hole forming area and the display area is less than a threshold value. Since the thickness of the planarization material formed by one coating is about 4 um, the threshold value may be 4 um, that is, the height difference between the hole forming area and the display area is not more than 4 um. In this way, when the planarization process is performed subsequently, a planar surface can be obtained by performing a single coating process on the display panel.

Specifically, the height difference between the hole forming area and the display area may range from 2 um to 4 um.

In order not to add an additional patterning process, in this embodiment, while some of the functional film layers in the display area are being formed, the functional film layers are also formed in the hole forming area. That is, while some of the functional film layers in the display area are being formed, the organic material layer is formed in the hole forming area by using the same patterning process. The pixel defining layer and the planarization layer of the display area are made of organic materials. Therefore, the organic material layer of the same materials as the pixel defining layer and the planarization layer can be formed in the hole forming area while the pixel defining layer and the planarization layer of the display area are being formed.

As shown in FIG. 2, in the related art, the pixel defining layer 6 and the planarization layer 4 are provided in the display area, and the pixel defining layer 6 and the planarization layer 4 are not kept in the hole forming area 14. As a result, a height difference D1 between the hole forming area 14 and the display area ranges from about 8 um to 10 um.

As shown in FIG. 3, in this embodiment, a second organic material sub-layer 15 and a first organic material sub-layer 16 are provided in the hole forming area 14, and the second organic material sub-layer 15 is made of the same material as the planarization layer 4, the first organic material sub-layer 16 is made of the same material as the pixel defining layer 6. By forming the organic material layer with the second organic material sub-layer 15 and the first organic material sub-layer 16, the thickness of the display panel in the hole forming area is increased, such that the height difference between the hole forming area 14 and the display area is reduced to D2, which ranges from 2 um to 4 um.

As long as it is ensured that the height difference between the surface of the display panel in the hole forming area 14 and the surface of the display panel in the display area is not more than 4 um, the thickness of the second organic material sub-layer 15 may be the same as the thickness of the planarization layer 4 of the display area, or may be less than the thickness of the planarization layer 4 of the display area, or may be greater than the thickness of the planarization layer 4 of the display area; the thickness of the first organic material sub-layer 16 may be the same as the thickness of the pixel defining layer 6 in the display area, or may be less than the thickness of the pixel defining layer 6 in the display area, or may be greater than the thickness of the pixel defining layer 6 in the display area.

When the thickness of the second organic material sub-layer 15 is different from the thickness of the planarization layer 4 of the display area, the second organic material sub-layer 15 and the planarization layer 4 can be fabricated by using a halftone mask or a gray-tone mask; when the thickness of the first organic material sub-layer 16 is different from the thickness of the pixel defining layer 6 in the display area, the first organic material sub-layer 16 and the pixel defining layer 6 can be fabricated by using a halftone mask or a gray-tone mask.

In a specific embodiment, the forming the second organic material sub-layer in the hole forming area and the planarization layer in the display area through the single patterning process includes:

forming a photosensitive organic material layer;

exposing the photosensitive organic material layer by using a gray-tone mask, where the gray-tone mask includes a partially light-transmitting pattern corresponding to the display area and an opaque pattern corresponding to the hole forming area;

after a development process is performed, the photosensitive organic material layer in the hole forming area remains to form the second organic material sublayer in the hole forming area, and part of the photosensitive organic material layer in the display area is removed to form the planarization layer in the display area, where a thickness of the second organic material sub-layer is greater than a thickness of the planarization layer in the display area.

In another specific embodiment, the forming the first organic material sub-layer in the hole forming area and the pixel defining layer in the display area through the single patterning process includes:

forming a photosensitive organic material layer;

exposing the photosensitive organic material layer by using a gray-tone mask, where the gray-tone mask includes a partially light-transmitting pattern corresponding to the display area and an opaque pattern corresponding to the hole forming area;

after a development process is performed, the photosensitive organic material layer in the hole forming area remains to form the first organic material sublayer in the hole forming area, and part of the photosensitive organic material layer in the display area is removed to form the pixel defining layer in the display area, where a thickness of the first organic material sub-layer is greater than a thickness of the pixel defining layer in the display area.

Specifically, as shown in FIG. 3, a separation wall is provided on an edge of the display area that is near the hole forming area. The separation wall defines the hole forming area. The separation wall includes a second separation sub-wall 12 and a first separation sub-wall 13, the second separation sub-wall 12 is made of the same material as the planarization layer 4, and the first separation sub-wall 13 is made of the same material as the pixel defining layer 6. In the related art, the thickness of the second separation sub-wall 12 is the same as the thickness of the planarization layer 4 of the display area, which can be about 2 um, and the thickness of the first separation sub-wall 13 can be larger than the thickness of the pixel defining layer 6 of the display area by about 2 um. In this embodiment, the thickness of the planarization layer 4 of the display area may still be about 2 um, the thickness of the second organic material sub-layer 15 may be about 4 um, the thickness of the pixel defining layer 6 of the display area may be about 2 um, the thickness of the first organic material sub-layer 16 may be about 4 um, and the thickness of the first organic material sub-layer 16 may be the same as the thickness of the first separation sub-wall 13, so that the height difference between the surface of the display panel in the hole forming area 14 and the surface of the display panel in the display area ranges from 2 um to 4 um.

Further, the display panel includes a thin film encapsulation layer covering the hole forming area and the display area. The method of manufacturing a display panel further includes: forming a thin film encapsulation layer covering the hole forming area and the display area.

As shown in FIG. 3, the thin film encapsulation layer is composed of a first inorganic thin film 8, an organic thin film 9 and a second inorganic thin film 10, where the organic thin film 9 is only provided in the display area, and the separation wall and the hole forming area are only provided with the first inorganic thin film 8 and the second inorganic thin film 10.

When the display panel is used to manufacture a display device, the hole forming area needs to be formed to accommodate devices such as cameras, sensors, and the like in the hole forming area. In order to facilitate the formation of the hole forming area, the organic material layer of the hole forming area and the film layer of the display area may be independent of each other. As shown in FIG. 3, the area 17 between the hole forming area and the display area is only provided with the first inorganic thin film 8 and the second inorganic thin film 10, the second organic material sub-layer 15 of the hole forming area and the second separation sub-wall 12 are independent of each other, and the first organic material sub-layer 16 and the first separation sub-wall 13 are independent of each other.

In a specific embodiment, when the second organic material sub-layer 15 of the hole forming area and the second separation sub-wall 12 are independent of each other, the manufacturing method specifically includes:

forming a photosensitive organic material layer;

exposing the photosensitive organic material layer by using a gray-tone mask, where the gray-tone mask includes a partially light-transmitting pattern corresponding to the display area, an opaque pattern corresponding to the hole forming area, and a light-transmitting pattern corresponding to the area 17;

after a development process, the photosensitive organic material layer of the hole forming area remains to form the second organic material sub-layer 15 in the hole forming area, part of the photosensitive organic material layer of the display area is removed to form the planarization layer 4 in the display area and the second separation sub-wall 12, where the thickness of the second organic material sub-layer is greater than the thickness of the planarization layer 4 in the display area and the second separation sub-wall 12; the photosensitive organic material layer of the area 17 is completely removed.

In another specific embodiment, when the first organic material sub-layer 16 in the hole forming area and the first separation sub-wall 13 are independent of each other, the manufacturing method specifically includes:

forming a photosensitive organic material layer;

exposing the photosensitive organic material layer by using a gray-tone mask, where the gray-tone mask includes a partially light-transmitting pattern corresponding to the display area and an opaque pattern corresponding to the hole forming area;

after a development process, the photosensitive organic material layer of the hole forming area remains to form the first organic material sub-layer 16 in the hole forming area, part of the photosensitive organic material layer of the display area is removed to form the pixel defining layer 6 in the display area and the first separation sub-wall 13, where the thickness of the first organic material sub-layer 16 is greater than the thickness of the pixel defining layer 6 in the display area; the photosensitive organic material layer of the area 17 is completely removed.

The present disclosure further provides, in an embodiment, a display device, including the display panel described above, and the display device further includes a planarization layer on the thin film encapsulation layer of the display panel, and a touch function layer on the planarization layer.

To form the planarization layer, since the height difference between the hole forming area and the display area is relatively small and not greater than the thickness of the planarization material formed by one coating process, merely one coating process performed on the display panel is required to complete the manufacture of the planarization layer.

During the manufacture of the display device, the display panel may be cut into a plurality of substrates, and hole forming areas are formed. Specifically, the hole forming area may be formed by laser cutting or mechanical stamping.

The display device includes, but is not limited to: a radio frequency unit, network module, audio output unit, input unit, sensor, display unit, user input unit, interface unit, memory, processor, power supply and the like. Those skilled in the art may understand that the above-mentioned display device structure does not constitute a limitation on the display device, and the display device may include more or less of the above-mentioned components, or combine certain components, or have different component arrangement. In the embodiments of the present disclosure, the display device includes, but is not limited to: a display, a mobile phone, a tablet computer, a television, a wearable electronic device, a navigation display device, and the like.

The display device may be any product or component with a display function, such as a TV, a display, a digital photo frame, a mobile phone, a tablet computer. The display device further includes a flexible printed circuit, a printed circuit board, and a backplane. It should be noted that the embodiments in this specification are described in a progressive manner, and the same or similar parts between the embodiments can be referred to each other. Each embodiment focuses on the differences from other embodiments. In particular, for the method embodiments, since they are basically similar to the product embodiments, the description is relatively simple, and for the relevant parts, references can be made to the description of the product embodiments.

Unless otherwise defined, the technical or scientific terms used in the present disclosure shall have the ordinary meanings understood by those of ordinary skill in the art to which the present disclosure belongs. The terms "first", "second", and the like used in this disclosure do not indicate any order, quantity, or priority, but are only used to distinguish different components. The terms "include", "have" or any variations thereof are intended to mean that an element or article followed by such a term encompasses a list of elements or articles preceded by such a term, or equivalents thereof, without precluding other elements or articles. Expressions such as "connection" or "connected" are not limited to physical or mechanical connections, but may include electrical connections, whether direct or indirect. Terms "Up", "down", "left", "right", etc. are only used to indicate the relative position relationship. When the absolute position of the described object changes, the relative position relationship may change accordingly.

It will be understood that when an element, such as a layer, film, area or substrate, is referred to as being "on" or "under" another element, it can be directly on or directly under the other element, or intervening elements may also be present.

The specific features, structures, materials or characteristics in the description of forgoing implementations may be combined in any one or more embodiments or examples in proper manners.

The above descriptions merely describe specific implementations of the present disclosure, and the scope of the present disclosure is not limited thereto. Any modifications or substitutions easily occurring to a person of ordinary skill in the art without departing from the principle of the present disclosure shall fall within the scope of the present disclosure. Therefore, the scope of the present disclosure is defined by the scope of the claims.

The invention claimed is:

1. A method of manufacturing a display panel, wherein the display panel comprises a display area and a hole forming area, the display area surrounds the hole forming area; the display area comprises: a thin film transistor array layer on a base substrate, a planarization layer covering the thin film transistor array layer, and a pixel defining layer on the planarization layer;
the method comprises:
forming a second organic material sub-layer in the hole forming area and the planarization layer in the display area through a single patterning process;
forming a first organic material sub-layer in the hole forming area and the pixel defining layer in the display area through a single patterning process,
wherein the first organic material sub-layer and the second organic material sub-layer form an organic material layer,
wherein the forming the second organic material sub-layer in the hole forming area and the planarization layer in the display area through the single patterning process comprises:
forming a photosensitive organic material layer;
exposing the photosensitive organic material layer by using a gray-tone mask, wherein the gray-tone mask comprises a partially light-transmitting pattern corresponding to the display area and an opaque pattern corresponding to the hole forming area;
performing a development process to form the second organic material sublayer in the hole forming area and the planarization layer in the display area, wherein a thickness of the second organic material sub-layer is greater than a thickness of the planarization layer in the display area.

2. The method according to claim 1, wherein a height difference between the hole forming area and the display area is less than a threshold value of 4 um.

3. A method of manufacturing a display panel, wherein the display panel comprises a display area and a hole forming area, the display area surrounds the hole forming area; the display area comprises: a thin film transistor array layer on a base substrate, a planarization layer covering the thin film transistor array layer, and a pixel defining layer on the planarization layer;
the method comprises:
forming a second organic material sub-layer in the hole forming area and the planarization layer in the display area through a single patterning process;
forming a first organic material sub-layer in the hole forming area and the pixel defining layer in the display area through a single patterning process,
wherein the first organic material sub-layer and the second organic material sub-layer form an organic material layer,
wherein the forming the first organic material sub-layer in the hole forming area and the pixel defining layer in the display area through the single patterning process comprises:
forming a photosensitive organic material layer;
exposing the photosensitive organic material layer by using a gray-tone mask, wherein the gray-tone mask comprises a partially light-transmitting pattern corresponding to the display area and an opaque pattern corresponding to the hole forming area;
performing a development process to form the first organic material sublayer in the hole forming area and the pixel defining layer in the display area, wherein a thickness of the first organic material sub-layer is greater than a thickness of the pixel defining layer in the display area.

4. The method according to claim 1, further comprising:
forming a thin film encapsulation layer covering the hole forming area and the display area.

* * * * *